United States Patent
Sakata et al.

(10) Patent No.: US 10,199,458 B2
(45) Date of Patent: Feb. 5, 2019

(54) SEMICONDUCTOR DEVICE

(71) Applicant: FUJI ELECTRIC CO., LTD., Kanagawa (JP)

(72) Inventors: Toshiaki Sakata, Matsumoto (JP); Mutsumi Kitamura, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 14/957,599

(22) Filed: Dec. 3, 2015

(65) Prior Publication Data
US 2016/0225847 A1 Aug. 4, 2016

(30) Foreign Application Priority Data
Jan. 29, 2015 (JP) ................... 2015-015457

(51) Int. Cl.
*H01L 29/06* (2006.01)
*H01L 29/78* (2006.01)

(52) U.S. Cl.
CPC ........ *H01L 29/0634* (2013.01); *H01L 29/063* (2013.01); *H01L 29/0615* (2013.01); *H01L 29/7802* (2013.01)

(58) Field of Classification Search
CPC ............. H01L 19/0634; H01L 29/0634; H01L 29/7395; H01L 29/0615; H01L 29/0611; H01L 29/063; H01L 29/0638; H01L 29/7827; H01L 29/06–29/0619; H01L 29/0646; H01L 29/1095; H01L 29/7802–29/7809; H01L 21/0455
USPC ........................................................ 257/339
See application file for complete search history.

(56) References Cited

U.S. PATENT DOCUMENTS

| | | | | |
|---|---|---|---|---|
| 7,112,519 B2* | 9/2006 | Yamaguchi | ......... | H01L 29/0634 257/330 |
| 7,859,048 B2* | 12/2010 | Kagata | ................ | H01L 29/0634 257/330 |
| 2001/0052601 A1* | 12/2001 | Onishi | ................ | H01L 29/0634 257/138 |

(Continued)

FOREIGN PATENT DOCUMENTS

| JP | 2004-72068 A | 3/2004 |
|---|---|---|
| JP | 2004-119611 A | 4/2004 |

(Continued)

OTHER PUBLICATIONS

Office Action issued for counterpart Japanese Application No. 2015-015457, drafted by the Japan Patent Office dated Oct. 9, 2018.

*Primary Examiner* — Eric Ward
*Assistant Examiner* — Eric Ashbahian

(57) ABSTRACT

Provided is a semiconductor device having a superjunction structure formed by a first conduction type column and a second conduction type column, including a first region of the superjunction structure in which a PN ratio increases in a direction from a first surface side to a second surface side of the superjunction structure; and a second region of the superjunction structure that contacts the first region and is adjacent to a channel region of the semiconductor device, wherein a PN ratio of the second region is less than the PN ratio at an end of the first region on the second surface side and thickness of the second region is less than thickness of the first region.

16 Claims, 17 Drawing Sheets

(56) References Cited

U.S. PATENT DOCUMENTS

| | | |
|---|---|---|
| 2004/0056306 A1 | 3/2004 | Saito |
| 2005/0082570 A1* | 4/2005 | Sridevan ............. H01L 29/0634 257/197 |
| 2006/0043481 A1* | 3/2006 | Yamashita .......... H01L 29/0634 257/341 |
| 2006/0284248 A1* | 12/2006 | Saito ................... H01L 29/0634 257/341 |
| 2008/0017897 A1 | 1/2008 | Saito et al. |
| 2008/0237774 A1 | 10/2008 | Ono et al. |
| 2008/0303114 A1* | 12/2008 | Shibata ............... H01L 29/0634 257/495 |
| 2009/0273031 A1* | 11/2009 | Saito ................... H01L 29/0634 257/339 |
| 2013/0026560 A1* | 1/2013 | Onishi ................ H01L 29/0634 257/329 |
| 2014/0077255 A1* | 3/2014 | Naijo .................. H01L 29/7397 257/139 |
| 2014/0374819 A1 | 12/2014 | Nimura |
| 2015/0041884 A1* | 2/2015 | Song .................... H01L 29/063 257/329 |

FOREIGN PATENT DOCUMENTS

| | | |
|---|---|---|
| JP | 2006-066421 A | 3/2006 |
| WO | 2014/013888 A1 | 1/2014 |

\* cited by examiner

SEMICONDUCTOR DEVICE

BACKGROUND

The contents of the following Japanese patent application are incorporated herein by reference:

NO. 2015-015457 filed in Japan on Jan. 29, 2015.

1. Technical Field

The present invention relates to a semiconductor device. In particular, the present invention relates to a semiconductor device having a superjunction structure.

2. Related Art

A conventional semiconductor device having a superjunction structure is known in which the impurity concentration changes according to the depth, such as shown in Patent Documents 1 to 4, for example. Furthermore, a semiconductor device having a superjunction structure is known that is provided with a P-type column and an N-type column with different heights, as shown in Patent Document 5, for example.

Patent Document 1: Japanese Patent Application Publication No. 2006-66421
Patent Document 2: International Publication WO 2011/093473
Patent Document 3: Japanese Patent Application Publication No. 2008-91450
Patent Document 4: Japanese Patent Application Publication No. 2004-72068
Patent Document 5: Japanese Patent Application Publication No. 2007-300034

With the conventional superjunction structure, however, the tradeoff between the ON resistance per unit area and the withstand voltage with respect to the PN variation, i.e. the variation between the total amount of n-type impurities in the n-type column and the total amount of p-type impurities in the p-type column, cannot be sufficiently improved.

SUMMARY

Therefore, it is an object of an aspect of the innovations herein to provide a semiconductor device, which is capable of overcoming the above drawbacks accompanying the related art. The above and other objects can be achieved by combinations described in the claims. According to a first aspect of the present invention, provided is a semiconductor device having a superjunction structure formed by a first conduction type column and a second conduction type column, comprising a first region of the superjunction structure in which a PN ratio increases in a direction from a first surface side to a second surface side of the superjunction structure; and a second region of the superjunction structure that contacts the first region and is adjacent to a channel region of the semiconductor device, wherein a PN ratio of the second region is less than the PN ratio at an end of the first region on the second surface side and thickness of the second region is less than thickness of the first region.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

(First Embodiment)

Figure 1:
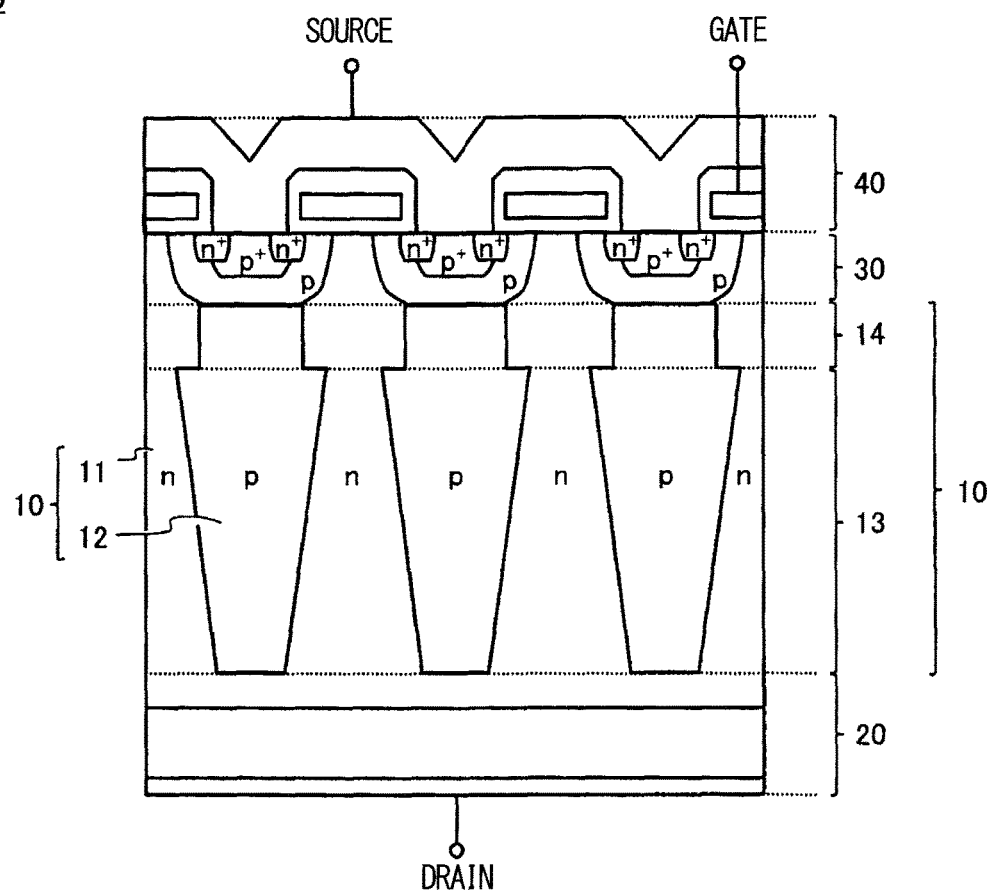
FIG. 1 shows an exemplary cross section of the structure of a semiconductor device 100 according to a first embodiment.

FIG. 1 shows an exemplary cross section of the structure of a semiconductor device 100 according to a first embodiment. The semiconductor device 100 includes a superjunction region 10, a drain region 20, a channel region 30, and a gate-source region 40. The drain region 20, the channel region 30, and the gate-source region 40 are merely examples, and the present invention is not limited to this structure.

The superjunction region 10 is provided between the drain region 20 and the channel region 30. The superjunction region 10 includes a column skew region 13 and a stepped region 14. The superjunction region 10 is provided with n-type columns 11 and p-type columns 12. The PN ratio of the superjunction region 10 may be set to be 1 throughout the entire superjunction region 10. The PN ratio of the superjunction region 10 refers to the ratio of the total amount of p-type impurities to the total amount of n-type impurities in the superjunction region 10. When the PN ratio of the entire superjunction region 10 is 1, the superjunction region 10 can be treated as resembling an undoped layer, and therefore the withstand voltage is increased.

The n-type columns 11 and the p-type columns 12 are formed in an alternating manner in a horizontal direction relative to the current path. When the semiconductor device 100 is ON, current flows through the n-type columns 11 from the drain region 20 side toward the channel region 30 side. Therefore, the ON resistance of the semiconductor device 100 depends heavily on the impurity concentration and the shape of the n-type columns 11. On the other hand, when the semiconductor device 100 is OFF, the depletion layer spreading from the p-type columns 12 causes the current to stop flowing through the n-type columns 11. The manner of the depletion of the superjunction region 10 changes according to the PN ratio of the superjunction region 10.

The withstand voltage of the superjunction region 10 changes according to the PN variation indicating the variation of the total amount of p-type impurities of the p-type column 12 and the total amount of n-type impurities of the n-type column 11 in the superjunction region 10. In order to improve reliability, the PN ratio of the superjunction region 10 is controlled to increase the withstand voltage margin relative to the PN variation. When the entire superjunction region 10 is formed to have a PN ratio of 1 at each depth, the depletion of the superjunction region 10 spreads uniformly in the depth direction, and the potential distribution is uniform in the depth direction. In such a case, when variation occurs in the PN ratio, the withstand voltage decreases significantly. Therefore, when increasing the PN ratio in a portion of the superjunction region 10, the withstand voltage margin for the PN variation is large. In the present Specification, the term "PN ratio" without any further description refers to the PN ratio at an arbitrary depth.

The column skew region 13 is a region in which the PN ratio is skewed in the thickness direction by the n-type columns 11 and the p-type columns 12. The PN ratio is skewed by skewing the shapes of the n-type columns 11 and the p-type columns 12. As another example, the PN ratio may be skewed by skewing the impurity concentrations of the n-type columns 11 and the p-type columns 12 in the depth direction. In the present example, the width of each n-type column 11 gradually decreases in a direction from the back surface side to the front surface side, while the width of each p-type column 12 gradually increases in a direction from the back surface side toward the front surface side. In this way, it is possible to realize a withstand voltage margin for the PN variation. This effect is particularly strong when the column pitch is small. In the present Specification, the front surface side refers to the side on which the gate-source region 40 is formed, and the back surface side refers to the side on which the drain region 20 is formed. The column thickness refers to the thickness in a direction perpendicular to the front surface of the semiconductor device 100. The column width refers to the width in a direction parallel to the front surface of the semiconductor device 100.

In the stepped region 14, the n-type columns 11 and the p-type columns 12 have a stepped shape. The widths of the n-type columns 11 and p-type columns 12 are constant in the stepped region 14. The stepped region 14 is formed in contact with the column skew region 13 and adjacent to the channel region 30. Being adjacent to the channel region 30 does not necessarily mean that the stepped region 14 contacts the channel region 30. However, the stepped region 14 and the channel region 30 do preferably contact each other. The side surfaces of the p-type columns 12 in the stepped region 14 are recessed relative to the side surface of the p-type columns 12 in the column skew region 13. In other words, the stepped region 14 is a region with a lower PN ratio than the column skew region 13. The thickness of the stepped region 14 may be less than the thickness of the column skew region 13. For example, the thickness of the stepped region 14 is ¼ to ⅛ the thickness of the superjunction region 10.

Figure 2:
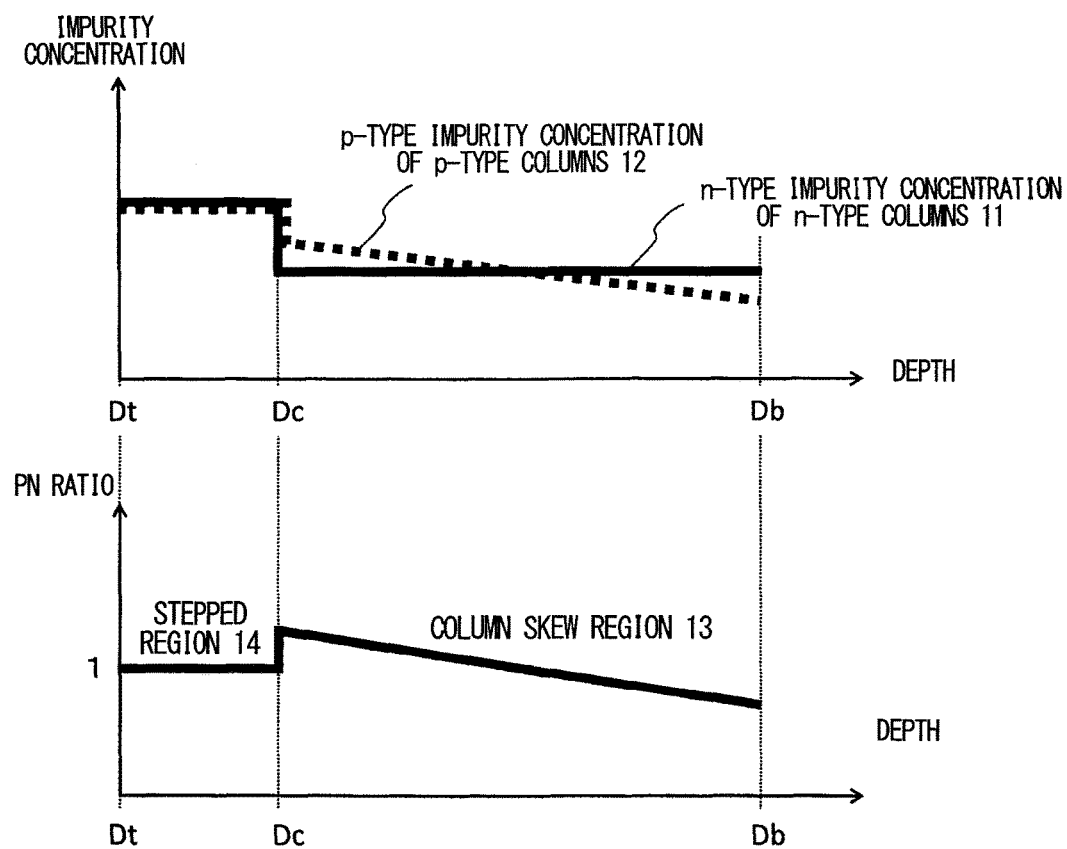
FIG. 2 shows an exemplary gradation of the PN ratio and impurity concentration according to the first embodiment.

FIG. 2 shows an exemplary gradation of the PN ratio and impurity concentration according to the first embodiment. The vertical axis indicates the PN ratio and the impurity concentration in the superjunction region 10. The horizontal axis indicates the depth from the end of the superjunction region 10 on the front surface side. In the present Specification, the impurity concentration in the depth direction of the columns refers to the impurity concentration through the center of the width of each column in the depth direction.

The depth Dt indicates the end of the superjunction region 10 on the front surface side, i.e. the end of the stepped region 14 on the front surface side. The depth Dc indicates the boundary between the column skew region 13 and the stepped region 14. The depth Db indicates the end of the superjunction region 10 on the back surface side, i.e. the end of the column skew region 13 on the back surface side. In other words, the depth from Dt to Dc corresponds to the stepped region 14 and the depth from Dc to Db corresponds to the column skew region 13.

In the column skew region 13, the impurity concentration of the p-type columns 12 increases in a direction from the back surface side to the front surface side of the superjunction region 10. On the other hand, in the column skew region 13, the impurity concentration of the n-type columns 11 is constant. Accordingly, the PN ratio of the column skew region 13 increases in a direction from the back surface side to the front surface side. The change of the PN ratio in the column skew region 13 may be continuous, or may be non-continuous. The PN ratio through the entire column skew region 13 may be set to be 1. In this case, for the p-type columns 12 and the n-type columns 11 in the column skew region 13, the total n-type impurity concentration in the n-type columns 11 and the total p-type impurity concentration in the p-type columns 12 are equal. Furthermore, the PN ratio may be 1 at the center of each column in the thickness direction in the column skew region 13.

In the stepped region 14, the impurity concentration of each n-type column 11 and p-type column 12 is constant. In the stepped region 14, the impurity concentrations of the n-type columns 11 and the p-type columns 12 are equal. The impurity concentration of the n-type columns 11 in the stepped region 14 may be higher than the impurity concentration of the n-type columns 11 in the column skew region 13. The impurity concentration of the p-type columns 12 in the stepped region 14 may be higher than the impurity concentration of the p-type columns 12 in the column skew region 13. For example, the impurity concentration of the p-type columns 12 in the stepped region 14 is at least 1.3 times the impurity concentration of the p-type columns 12 in the column skew region 13. As described above, the impurity concentrations of the n-type columns 11 and the p-type columns 12 in the stepped region 14 are equal, and therefore the PN ratio of the stepped region 14 is 1. Furthermore, the PN ratio of the stepped region 14 is greater than the PN ratio at the end of the column skew region 13 on the back surface side.

The step in the PN ratio at the boundary between the stepped region 14 and the column skew region 13 is set to be a value corresponding to the desired withstand voltage. When the PN ratio of the column skew region 13 is 1, the step in the PN ratio at this boundary is determined according to the PN ratio at the end of the column skew region 13 on the front surface side. For example, when the withstand voltage is 400 V, the PN ratio at the end of the column skew region 13 on the front surface side is greater than 1 and less than or equal to 1.5. When the withstand voltage is 600 V, the PN ratio at the end of the column skew region 13 on the front surface side may be greater than 1 and less than or equal to 1.3. In other words, when the withstand voltage is larger, the step in the PN ratio at the boundary between the stepped region 14 and the column skew region 13 should be smaller.

As described above, the semiconductor device 100 increases the PN ratio on the front surface side of the column skew region 13, and decreases the PN ratio on the back surface side of the column skew region 13. Therefore, the PN variation has a greater margin than in a case where the PN ratio is constant. Furthermore, by increasing the impurity concentration in the stepped region 14, the semiconductor device 100 makes it more difficult for the depletion layer to widen. Accordingly, the semiconductor device 100 can decrease the rate of change over time of the drain voltage (dv/dt) when the semiconductor device 100 is turned OFF. As a result, it is possible to improve the Eoff–dv/dt relationship of the tradeoff with the turn-off switching losses (Eoff) when the semiconductor device 100 is turned OFF.

(First Comparative Example)

Figure 3:
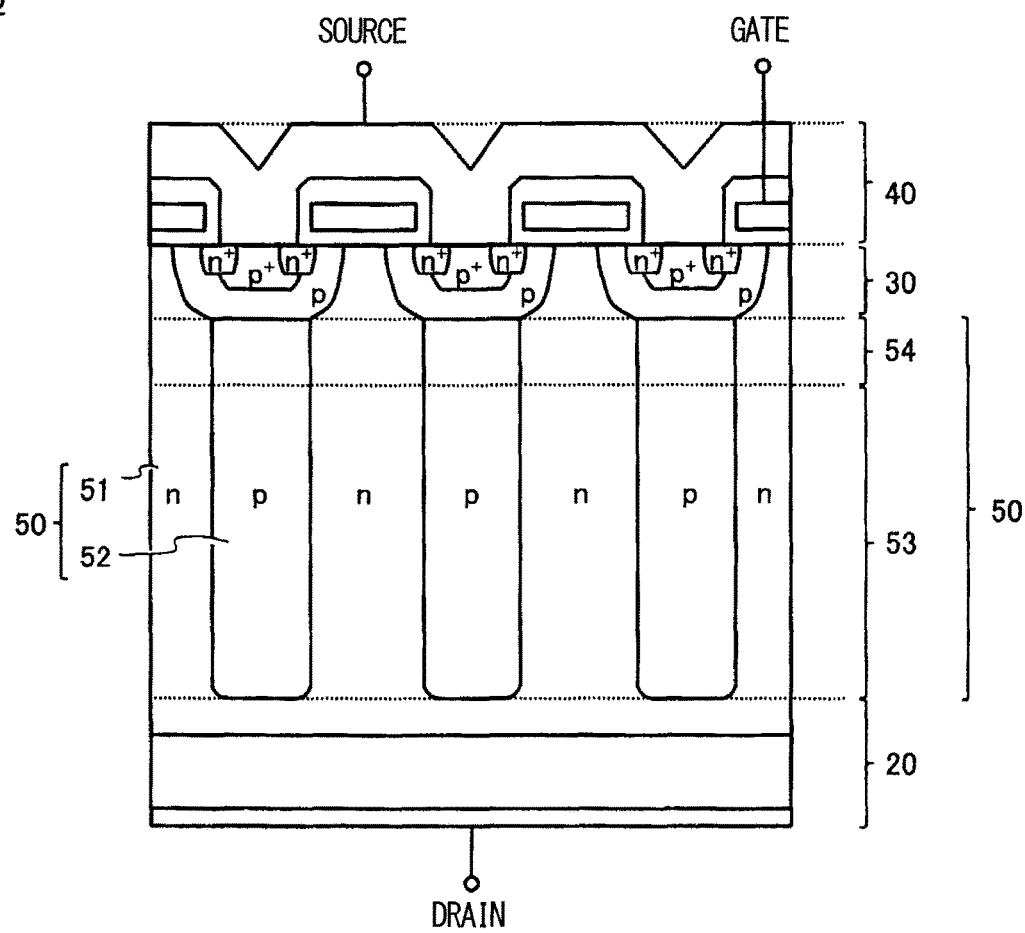
FIG. 3 shows an exemplary cross section of the structure of a semiconductor device 500 according to a first comparative example.

FIG. 3 shows an exemplary configuration of a semiconductor device 500 according to a first comparative example. The semiconductor device 500 of this example includes a superjunction region 50 formed by n-type columns 51 and p-type columns 52. In the semiconductor device 500, structures other than the superjunction region 50 are basically the same as in the semiconductor device 100. The superjunction region 50 of this example includes a low concentration region 53 and a high concentration region 54.

The low concentration region 53 is formed adjacent to the drain region 20. In the low concentration region 53, the n-type columns 51 and the p-type columns 52 have the same impurity concentration. In other words, the widths of the n-type columns 51 and the p-type columns 52 are not skewed and are constant across the entire low concentration region 53.

The high concentration region 54 is formed in contact with the end of the low concentration region 53 on the front surface side and adjacent to the channel region 30. The impurity concentration of the high concentration region 54 is higher than the impurity concentration of the low concentration region 53. In the high concentration region 54, the n-type columns 51 and p-type columns 52 have constant impurity concentrations. In other words, the widths of the n-type columns 51 and the p-type columns 52 are not skewed and are constant across the entire high concentration region 54.

Figure 4:
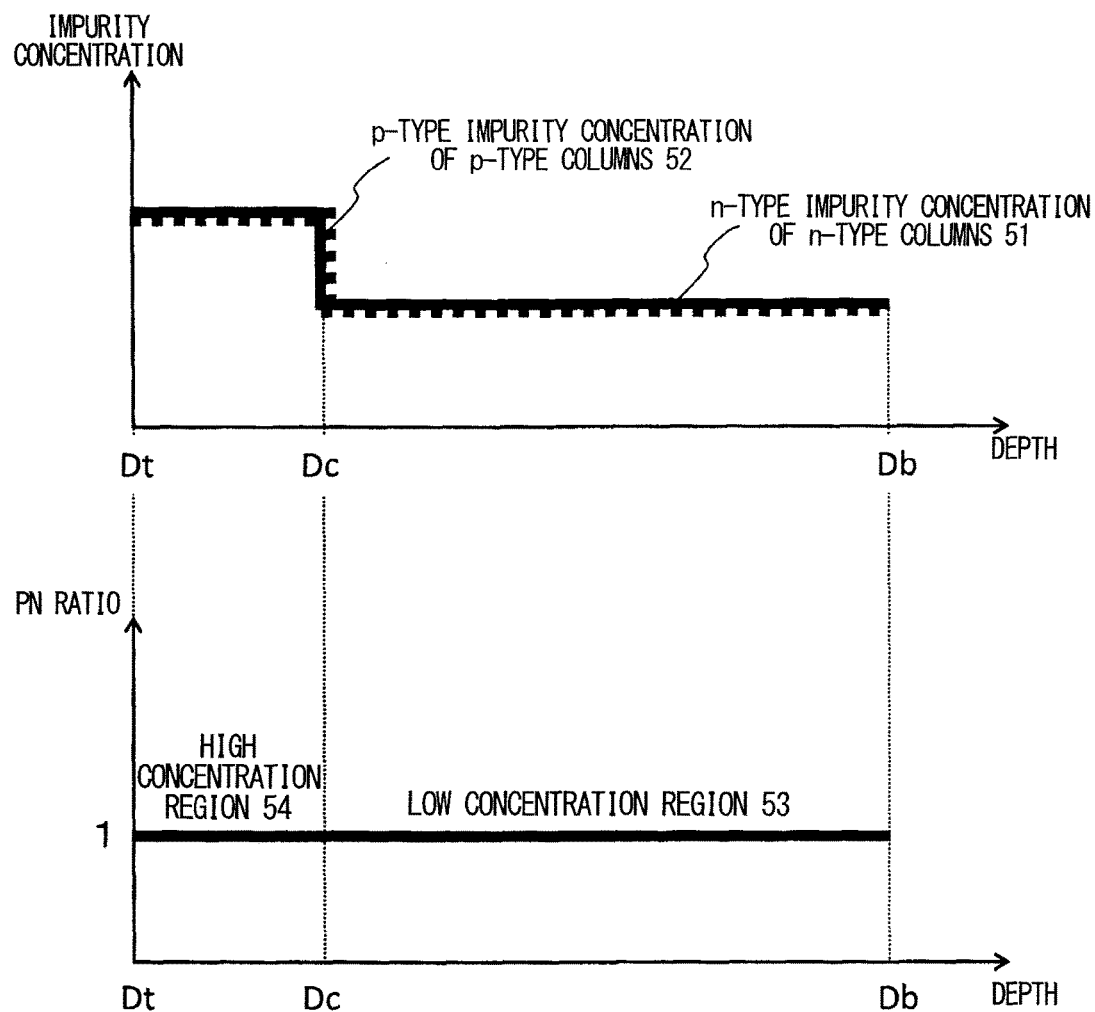
FIG. 4 shows an exemplary gradation of the PN ratio and impurity concentration according to the first comparative example.

FIG. 4 shows an exemplary gradation of the PN ratio and the impurity concentration according to the first comparative example. The vertical axis indicates the PN ratio and the impurity concentration in the superjunction region 50. The horizontal axis indicates the depth from the end of the superjunction region 50 on the front surface side.

The depth Dt indicates the end of the superjunction region 50 on the front surface side, i.e. the end of the high concentration region 54 on the front surface side. The depth Dc indicates the boundary between the low concentration region 53 and the high concentration region 54. The depth Db indicates the end of the superjunction region 50 on the back surface side, i.e. the end of the low concentration region 53 on the back surface side. In other words, the depth from Dt to Dc corresponds to the high concentration region 54 and the depth from Dc to Db corresponds to the low concentration region 53.

In the low concentration region 53, the impurity concentrations of the n-type columns 51 and the p-type columns 52 are constant. In the high concentration region 54 as well, the impurity concentrations of the n-type columns 51 and the p-type columns 52 are constant. In the superjunction region 50 of this example, the impurity concentrations of the n-type columns 51 and the p-type columns 52 are equal to each other in the low concentration region 53 and are also equal to each other in the high concentration region 54. In other words, The PN ratio is 1 across the entire superjunction region 50. Accordingly, the total n-type impurity concentration in the n-type columns 11 and the total p-type impurity concentration in the p-type columns 12 are equal across the entire superjunction region 50. The impurity concentration of the high concentration region 54 is set to be 1.5 times the impurity concentration of the low concentration region 53, for example.

As described above, in the semiconductor device 500 according to the present embodiment, the concentration of the high concentration region 54 provided closer to the front surface than the low concentration region 53 is high. As a result, the Vd/Vt value of the semiconductor device 500 is small. Accordingly, the semiconductor device 500 is capable of improving the Eoff–Vd/Vt characteristic. However, in the semiconductor device 500, the PN ratio is 1 across the entire superjunction region 50, and therefore the withstand voltage margin for the PN variation is low and the avalanche breakdown amount is low.

(Second Comparative Example)

Figure 5:
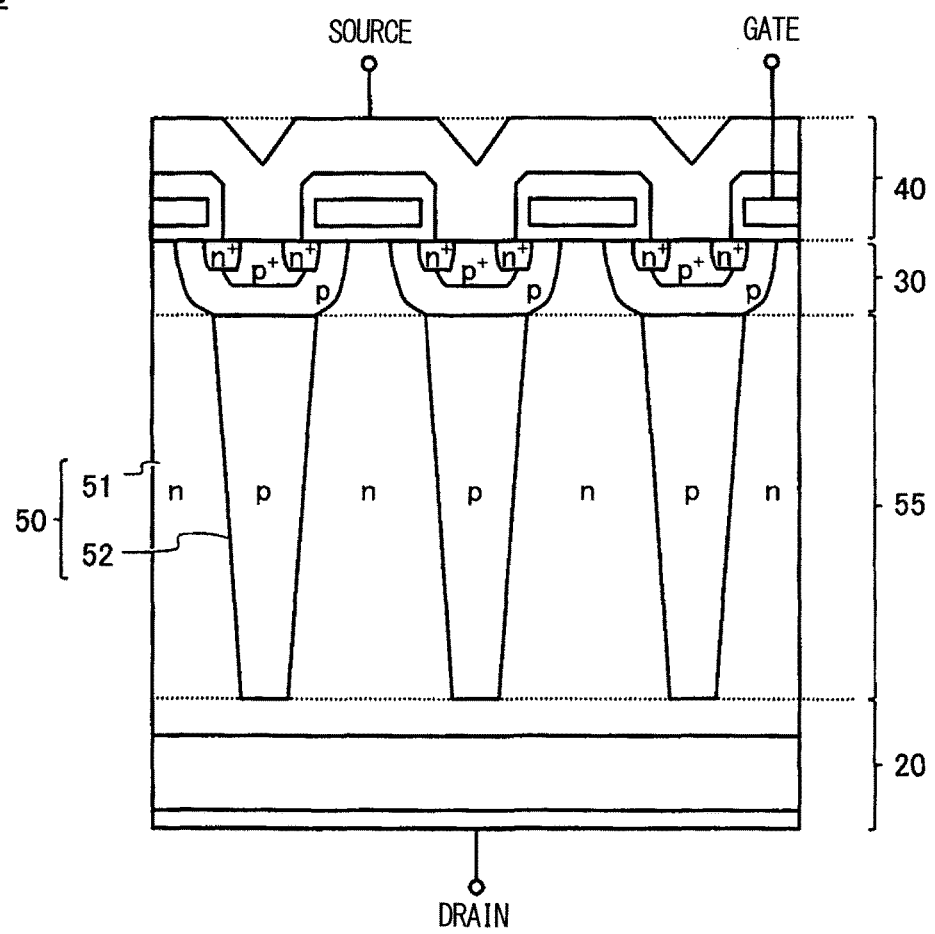
FIG. 5 shows an exemplary cross section of the structure of a semiconductor device 500 according to a second comparative example.

FIG. 5 shows an exemplary configuration of a semiconductor device 500 according to a second comparative example. The semiconductor device 500 of this example includes a superjunction region 50 that has a column skew region 55. In the column skew region 55, n-type columns 51 and the p-type columns 52 are shaped with skewed side surfaces.

The column skew region 55 is formed adjacent to the drain region 20 and the channel region 30. In the column skew region 55, the n-type columns 51 have widths that become gradually narrower in a direction from the back surface side to the front surface side of the semiconductor device 500. The impurity concentration of the n-type columns 51 is constant in the column skew region 55. In the column skew region 55, the p-type columns 52 have widths that become gradually wider in a direction from the back surface side to the front surface side of the semiconductor device 500. The impurity concentration of the p-type columns 52 becomes gradually higher in a direction from the back surface side to the front surface side of the semiconductor device 500 in the column skew region 55.

Figure 6:
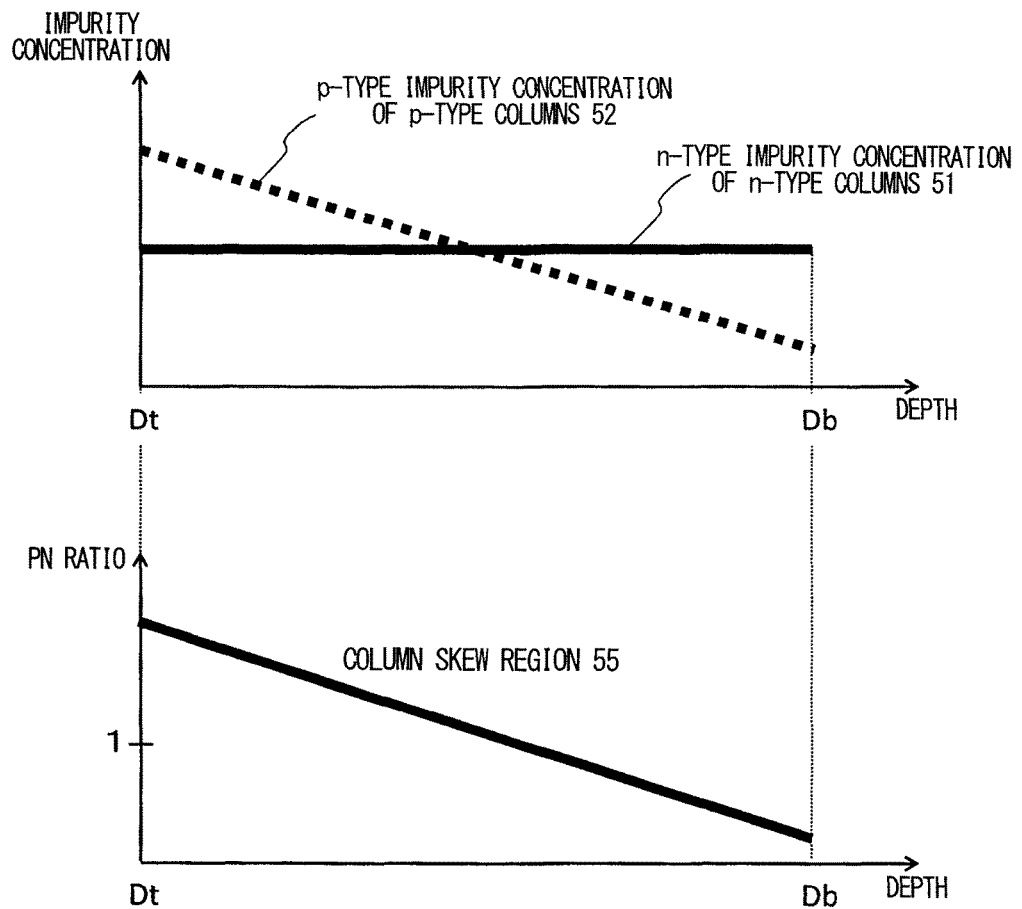
FIG. 6 shows an exemplary gradation of the PN ratio and impurity concentration according to the second comparative example.

FIG. 6 shows an exemplary gradation of the PN ratio and the impurity concentration according to the second comparative example. The vertical axis indicates the PN ratio and the impurity concentration in the superjunction region 50. The horizontal axis indicates the depth from the end of the superjunction region 50 on the front surface side. In this example, the impurity concentration of the n-type columns 51 is different from the impurity concentration of the p-type columns 52.

The depth Dt indicates the end of the superjunction region 50 on the front surface side. The depth Db indicates the end of the superjunction region 50 on the back surface side. In other words, the depth from Dt to Db corresponds to the column skew region 55.

In the column skew region 55, the impurity concentration of the p-type columns 52 gradually decreases in a direction from the depth Dt toward the depth Db. On the other hand, in the column skew region 55, the impurity concentration of the n-type columns 51 is the same at each depth in the superjunction region 50. Accordingly, the PN ratio of the column skew region 55 gradually decreases in a direction from the depth Dt toward the depth Db.

As described above, the semiconductor device 500 according to the second comparative example increases the PN ratio on the front surface side and decreases the PN ratio on the back surface side, thereby increasing the electrical field near the center in the OFF state. Accordingly, even when there is PN variation, the electric field near the center of the superjunction region 50 is mitigated, and therefore a withstand voltage margin can be realized. However, in the semiconductor device 500 according to the second comparative example, when the processing becomes more fine and the cell pitch becomes narrow, the current path is constricted on the front surface side and the ON resistance increases.

(Third Comparative Example)

Figure 7:
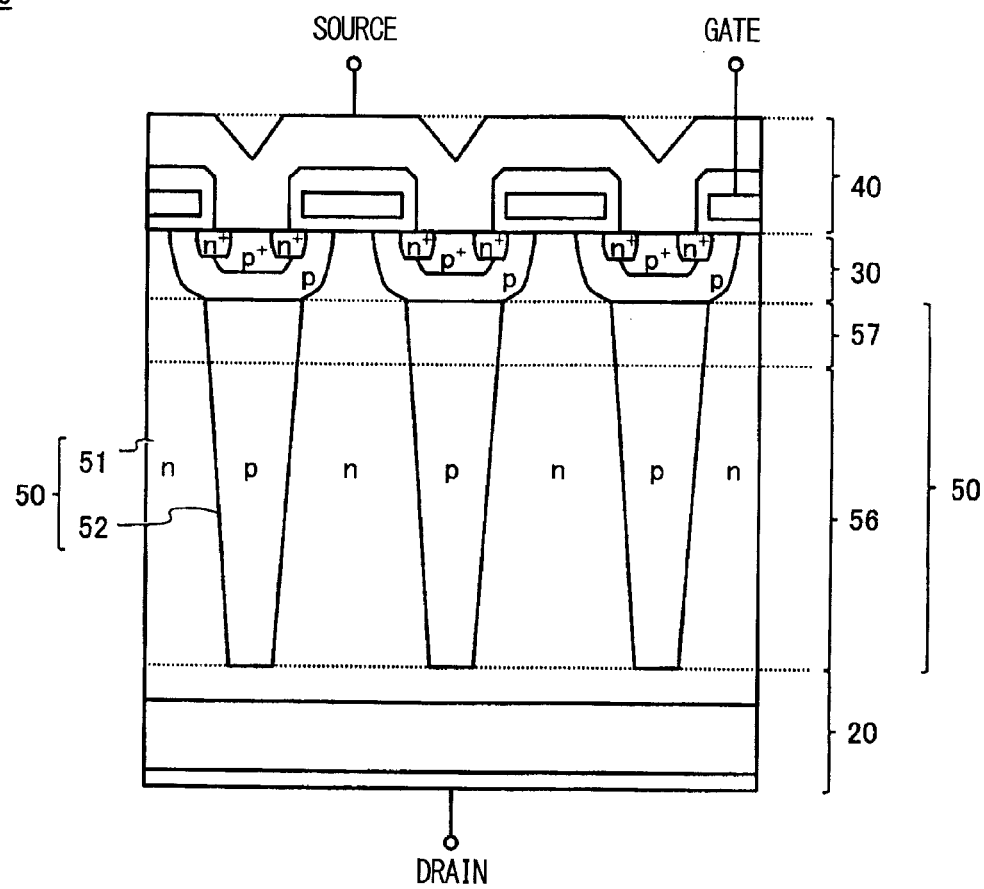
FIG. 7 shows an exemplary cross section of the structure of a semiconductor device 500 according to a third comparative example.

FIG. 7 shows an exemplary structure of a semiconductor device 500 according to a third comparative example. The semiconductor device 500 includes a superjunction region 50 having a low concentration skewed region 56 and a high concentration skewed region 57. The semiconductor device 500 according to the third comparative example is a combination of the structures of the first comparative example and the second comparative example.

In the low concentration skewed region 56, the side surfaces of the n-type columns 51 and the p-type columns 52 are skewed relative to the depth direction and the impurity concentrations of the n-type columns 51 and the p-type columns 52 are low. In the low concentration skewed region 56, the width of each n-type column 51 gradually decreases in a direction from the back surface side toward the front surface side, while the width of each p-type column 52 gradually increases in a direction from the back surface side to the front surface side.

In the high concentration skewed region 57, the side surfaces of the n-type columns 51 and the p-type columns 52 are skewed relative to the depth direction and the impurity concentrations of the n-type columns 51 and the p-type columns 52 are higher than in the low concentration skewed region 56. In the high concentration skewed region 57 as well, the width of each n-type column 51 gradually decreases in a direction from the back surface side toward the front surface side, while the width of each p-type column 52 gradually increases in a direction from the back surface side to the front surface side.

Figure 8:
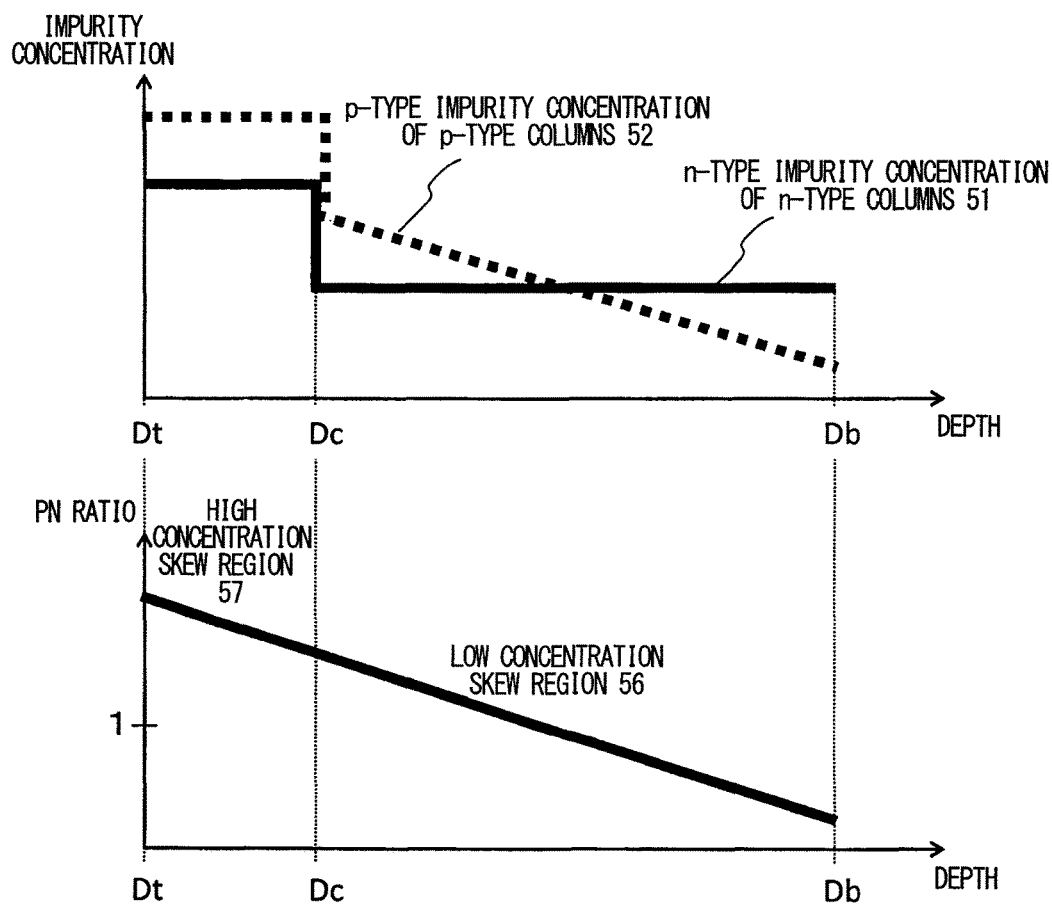
FIG. 8 shows an exemplary gradation of the PN ratio and impurity concentration according to the third comparative example.

FIG. 8 shows an exemplary gradient of the PN ratio and the impurity concentration according to the third comparative example. The vertical axis indicates the PN ratio and the impurity concentration in the superjunction region 50. The horizontal axis indicates the depth from the end of the superjunction region 50 on the front surface side.

The depth Dt indicates the end of the superjunction region 50 on the front surface side, i.e. the end of the high concentration skewed region 57 on the front surface side. The depth Dc indicates the boundary between the low concentration skewed region 56 and the high concentration skewed region 57. The depth Db indicates the end of the superjunction region 50 on the back surface side, i.e. the end of the low concentration skewed region 56 on the back surface side. In other words, the depth from Dt to Dc corresponds to the high concentration skewed region 57 and the depth from Dc to Db corresponds to the low concentration skewed region 56.

In the low concentration skewed region 56, the impurity concentration of the n-type columns 51 is constant at each depth in the superjunction region 50. On the other hand, the impurity concentration of the p-type columns 52 gradually increases in a direction from the back surface side to the front surface side of the low concentration skewed region 56. Accordingly, the PN ratio of the low concentration skewed region 56 gradually increases in a direction from the back surface side to the front surface side of the low concentration skewed region 56. In the low concentration skewed region 56, in a region that is on the front surface side of the center of the low concentration skewed region 56, the impurity concentration of the p-type columns 52 is greater than the impurity concentration of the n-type columns 51. On the other hand, in a region that is on the back surface side of the center of the low concentration skewed region 56, the impurity concentration of the p-type columns 52 is less than the impurity concentration of the n-type columns 51.

In the high concentration skewed region 57, the impurity concentrations of the n-type columns 51 and the p-type columns 52 are higher than the respective impurity concentrations of the n-type columns 51 and the p-type columns 52 in the low concentration skewed region 56. In the high concentration skewed region 57, the impurity concentration of the p-type columns 52 is higher than the impurity concentration of the n-type columns 51. The impurity concentrations of the n-type columns 51 and the p-type columns 52 are constant. In the high concentration skewed region 57, the width of each p-type column 52 gradually increases in a direction from the back surface side to the front surface side. In other words, the PN ratio of the high concentration skewed region 57 gradually increases in a direction from the back surface side to the front surface side.

As described above, the semiconductor device 500 according to the third comparative example is a combination of the features according to the first comparative example and the second comparative example. However, in the third comparative example, the PN ratio is set to be high on the front surface side of the semiconductor device 500, and therefore it is easy for the depletion layer to widen in the front surface side of the n-type columns 51. Therefore, the effect of restricting dv/dt by restricting the widening of the depletion layer on the front surface side of the semiconductor device 500 in the first comparative example is weakened.

Accordingly, the semiconductor device 500 according to the third comparative example cannot sufficiently improve the tradeoff of Eoff–dv/dt.

Figure 9:
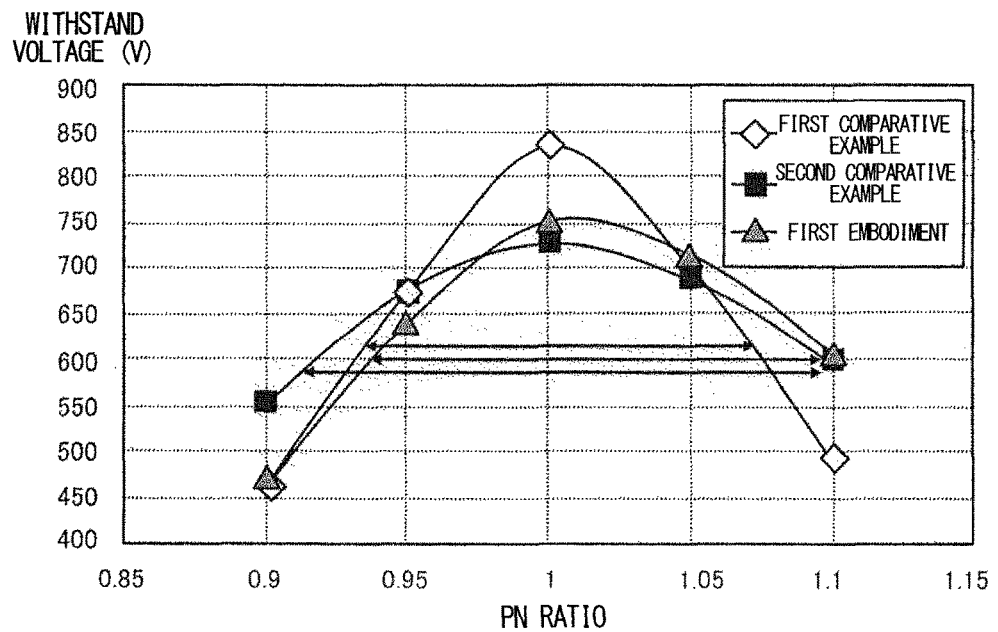
FIG. 9 shows a comparison of each structure for the withstand voltage relative to the PN ratio.

FIG. 9 shows a comparison of each structure for the withstand voltage relative to the PN ratio. The vertical axis indicates the withstand voltage (V) and the horizontal axis indicates the PN ratio of the entire superjunction region. In this example, comparisons of the withstand voltages of the structures of the first comparative example and the second comparative example are made while changing the PN ratio in units of 0.05 from a PN ratio of 0.9 to a PN ratio of 1.1.

In the first comparative example, a withstand voltage greater than or equal to 600 V can be realized for PN ratios from 0.93 to 1.07 (PN ratio width of 0.14). In the second comparative example, a withstand voltage greater than or equal to 600 V can be realized for PN ratios from 0.92 to 1.1 (PN ratio width of 0.18). Furthermore, in the first embodiment, a withstand voltage greater than or equal to 600 V can be realized for PN ratios from 0.93 to 1.1 (PN ratio width of 0.17). Accordingly, with the first comparative example, the PN ratio range for which a withstand voltage of 600 V can be achieved is smaller than in the other examples. The first comparative example also exhibits the largest change in the withstand voltage when PN variation occurs.

Figure 10:
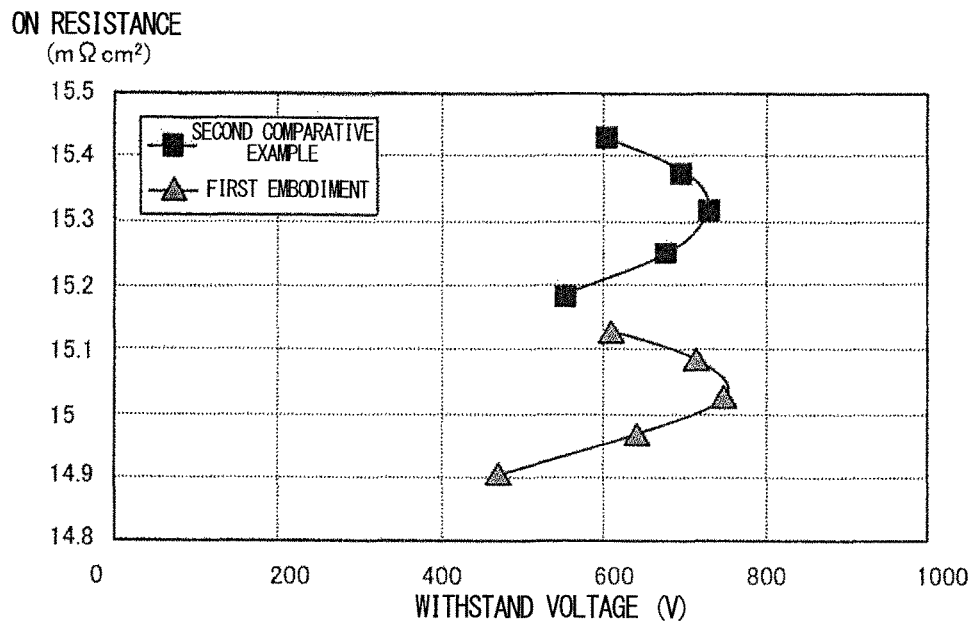
FIG. 10 shows a comparison of the ON resistance relative to the withstand voltage for each structure.

FIG. 10 shows a comparison of the ON resistance relative to the withstand voltage for each structure. In this example, the ON resistances (m$\Omega$cm$^2$) and withstand voltages (V) of the first comparative example and the second comparative example are compared while changing the PN ratio of each superjunction region in the same manner as described in FIG. 9. For each structure, the impurity concentrations of the n-type columns and the p-type columns are set to be the same.

In the first embodiment, for every PN ratio, the ON resistance is lower than in the second comparative example. Accordingly, with the second comparative example, it is possible to achieve a withstand voltage of 600 V in the same PN ratio range as in the first embodiment, but the ON resistance is higher. As described above, the semiconductor device 100 according to the first embodiment can realize a low ON resistance while maintaining a high withstand voltage margin relative to the PN variation.

(Second Embodiment)

Figure 11A:
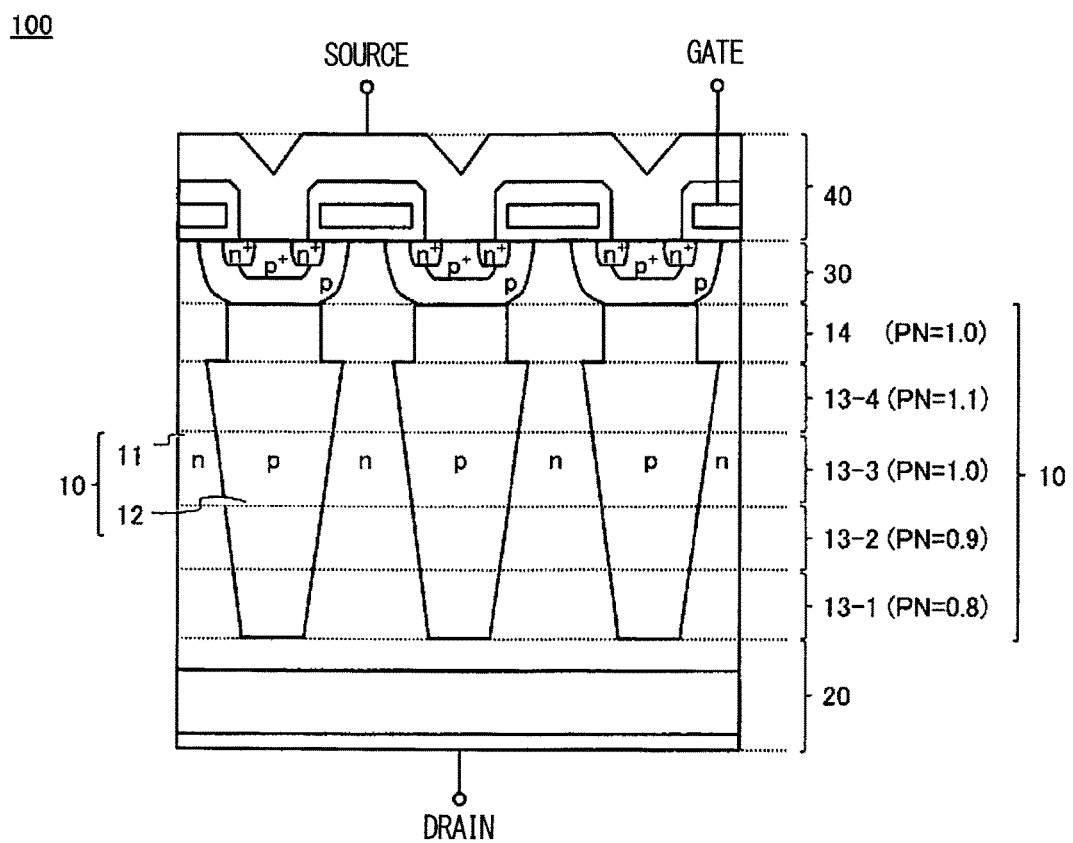
FIG. 11A shows an exemplary configuration of a semiconductor device 100 according to a second embodiment.

FIGS. 11A to 11E show an exemplary manufacturing method using multi-stage epitaxy. FIG. 11A shows an exemplary configuration of a semiconductor device 100 according to a second embodiment. The semiconductor device 100 of this example includes a superjunction region 10 that is manufactured using multi-stage epitaxy.

The superjunction region 10 is formed on the drain region 20 using multi-stage epitaxy. The superjunction region 10 of this example is epitaxially grown in five stages. The drain region 20 includes a high-concentration silicon substrate, for example. A buffer layer may be formed between the superjunction region 10 and the drain region 20.

The column skew region 13 is formed by epitaxial growth through the first four stages. The regions formed in these four stages include a first column skew region 13-1, a second column skew region 13-2, a third column skew region 13-3, and a fourth column skew region 13-4. The PN ratios of the first column skew region 13-1 to the fourth column skew region 13-4 are respectively 0.8, 0.9, 1.0, and 1.1, for example. The number of stages in the multi-stage epitaxial growth of the column skew region 13 may be an even number or an odd number. In other words, the combination of the PN ratios of the respective layers and the number of stages of the multi-stage epitaxial growth may be changed as desired according to the desired magnitude of the withstand voltage.

The stepped region 14 is formed by the fifth stage of the epitaxial growth, which is the final stage. The stepped region 14 is formed to have a PN ratio of 1. The stepped region 14 of this example is formed through a single instance of epitaxial growth, but may instead be formed through multiple stages.

Figure 11B:
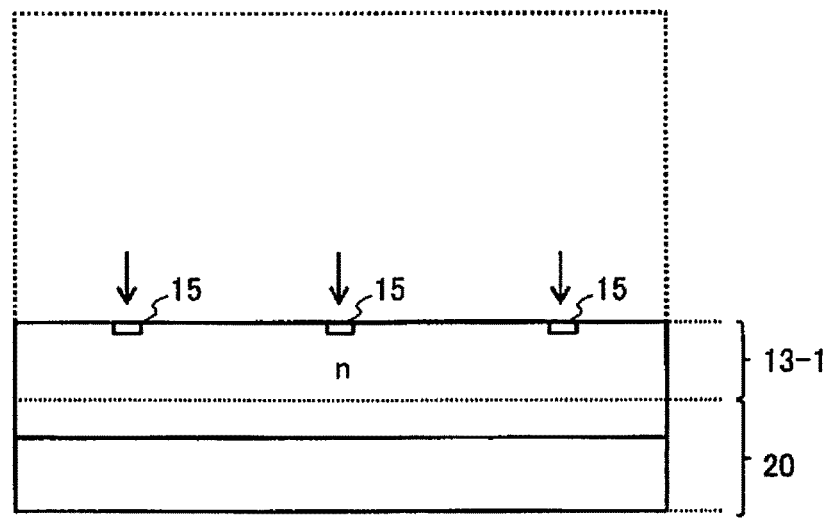
FIG. 11B shows an exemplary ion injection stop of the first column skew region 13-1 according to the second embodiment.

FIG. 11B shows an exemplary ion injection step of the first column skew region 13-1 according to the second embodiment. The ion injection region 15 is formed by the ion injection step.

The first column skew region 13-1 is formed by epitaxially growing a low-concentration n-type semiconductor layer on the drain region 20. The thickness of the first column skew region 13-1 is determined according to the desired withstand voltage, the apparatus being used, and the like. The thickness of the first column skew region 13-1 is 5 μm, for example. The thickness of each layer in the column skew region 13 may be changed depending on the layer.

The ion injection region 15 is formed by injecting ions that are p-type impurities into the front surface side of the first column skew region 13-1. The ion injection region 15 forms the p-type columns 12 of the first column skew region 13-1 through a diffusion step performed later. The center of each p-type column 12 basically matches the center of the ion injection region 15. The dose amount of the ion injection region 15 differs according to the PN ratio of the first column skew region 13-1. Furthermore, the pattern of the ion injection region 15 may be changed according to the PN ratio of the first column skew region 13-1. In the present example, the n-type semiconductor layer is epitaxially grown and the ion injection is performed to form the p-type columns 12, but instead, a p-type semiconductor layer may be epitaxially grown and the ion injection may be performed to form the n-type columns 11.

Figure 11C:
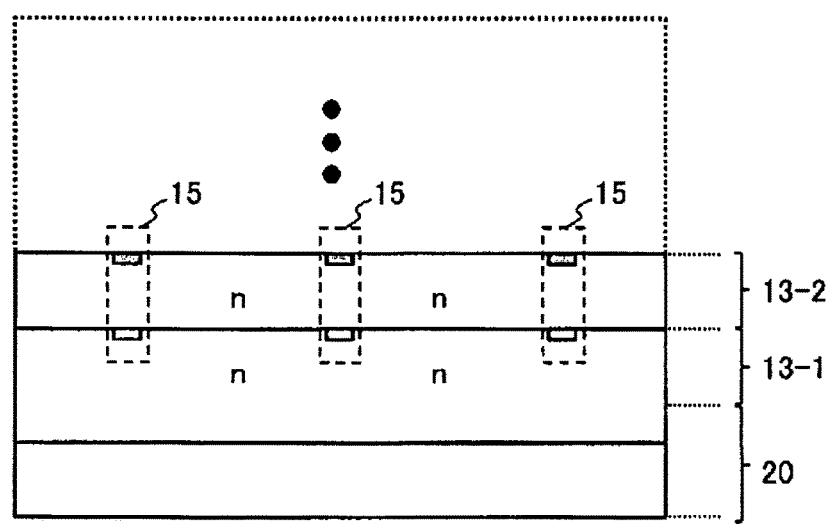
FIG. 11C shows an exemplary ion injection step of the second column skew region 13-2.

FIG. 11C shows an exemplary ion injection step of the second column skew region 13-2. The second column skew region 13-2 has a higher PN ratio than the first column skew region 13-1, and therefore ion injection is performed with a higher dose amount in the ion injection region 15 formed on the first column skew region 13-1. The pattern of the ion injection region 15 in the second column skew region 13-2 may be larger than the pattern of the ion injection region 15 in the first column skew region 13-1. After this, the third column skew region 13-3, the fourth column skew region 13-4, and the stepped region 14 are formed by repeating similar ion injection steps and epitaxial growth steps. The epitaxial growth step of the stepped region 14 may include forming a layer that includes a higher concentration of n-type impurities than in a case of epitaxial growth of the column skew region 13.

Figure 11D:
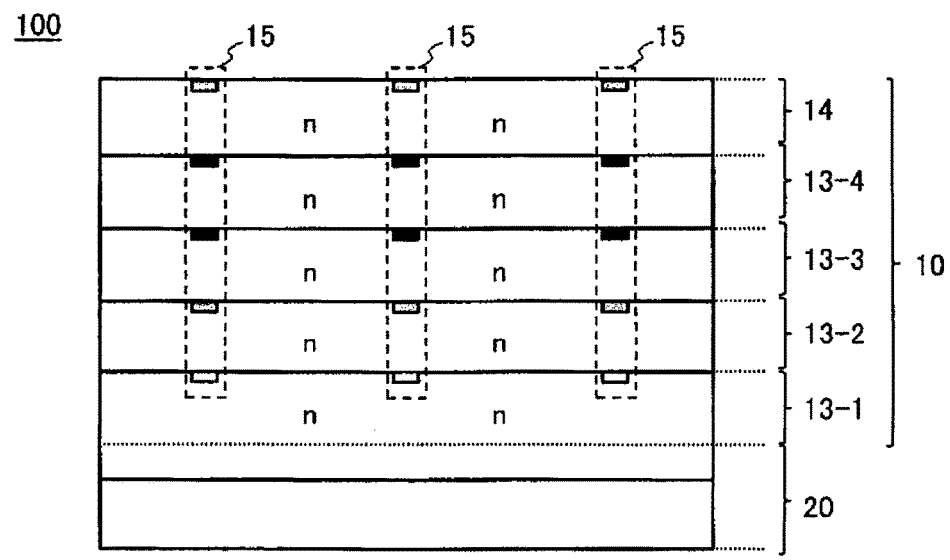
FIG. 11D shows an exemplary manufacturing step of the superjunction region 10.

FIG. 11D shows an exemplary manufacturing step of the superjunction region 10 according to the second embodiment. The superjunction region 10 of this example shows a state in which the ion injection region 15 has been formed in each layer in the column skew region 13 and the stepped region 14. The column skew region 13 and the stepped region 14 include the ion injection region 15 with a concentration corresponding to the formed PN ratio. Each ion injection region 15 in the column skew region 13 of this example has an impurity concentration that gradually increases in a direction from the back surface side toward the front surface side. The stepped region 14 is epitaxially grown to have an n-type impurity concentration that is higher than that of the column skew region 13. The n-type impurity concentration of the stepped region 14 may be increased through high-concentration ion injection.

Figure 11E:
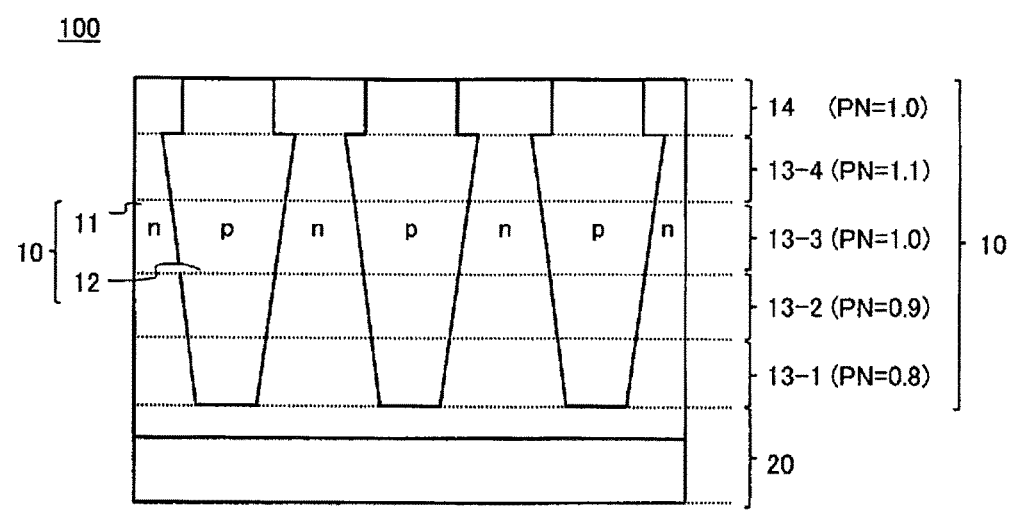
FIG. 11E shows an exemplary structure of a semiconductor device 100 according to the second embodiment after the diffusion step.

FIG. 11E shows an exemplary structure of a semiconductor device 100 according to the second embodiment after the diffusion step. As a result of the diffusion step of the semiconductor device 100, the n-type columns 11 and p-type columns 12 are formed. The side surfaces of the n-type columns 11 and the p-type columns 12 in this example have an approximately linear skew. The n-type columns 11 and the p-type columns 12 do not need to have the structures shown in this example, and may have any structure that realizes the combination of the set PN ratios of the first column skew region 13-1 to fourth column skew region 13-4.

(Third Embodiment)

Figure 12A:
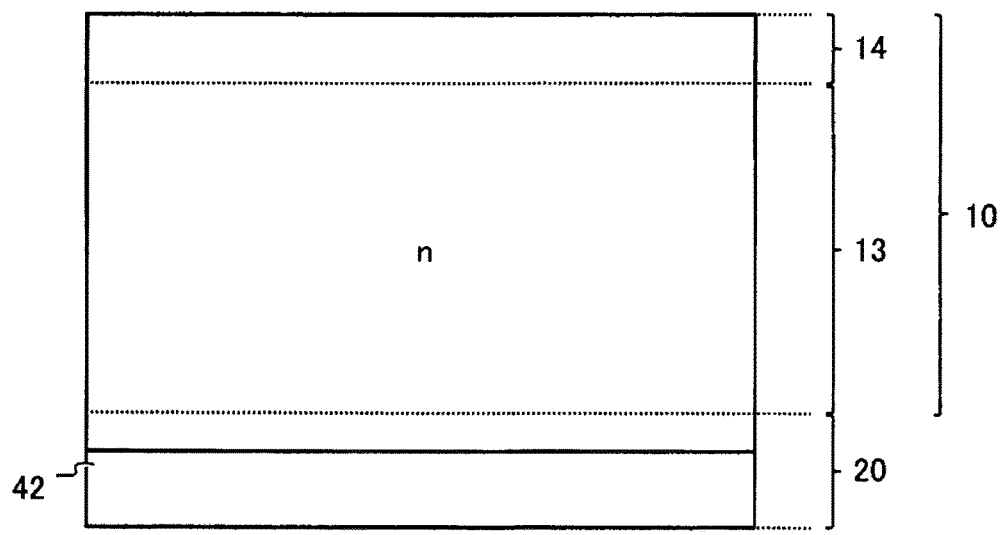
FIG. 12A shows a superjunction region 10 after epitaxial growth.

FIGS. 12A to 12E show an exemplary manufacturing process using trench embedding. FIG. 12A shows a superjunction region 10 after epitaxial growth. The semiconductor device 100 of this example includes a superjunction region 10 that is manufactured using trench embedding. The superjunction region 10 is epitaxially grown in one stage.

Figure 12B:
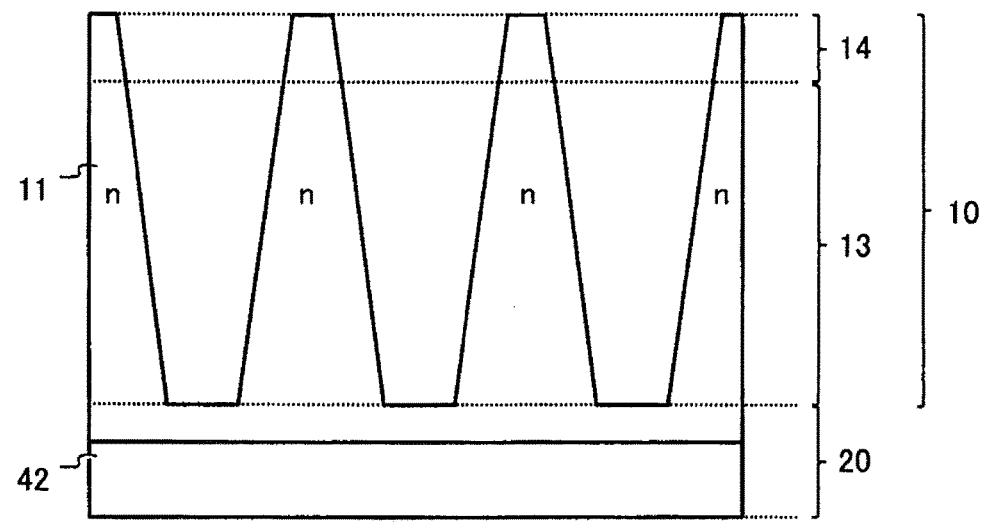
FIG. 12B shows an exemplary structure of the semiconductor device 100 after the trench formation step.

FIG. 12B shows an exemplary structure of the semiconductor device 100 after the trench formation step. A trench structure having the shape of the p-type columns 12 is formed by performing deep trench etching of the superjunction region 10 after the epitaxial growth.

Figure 12C:
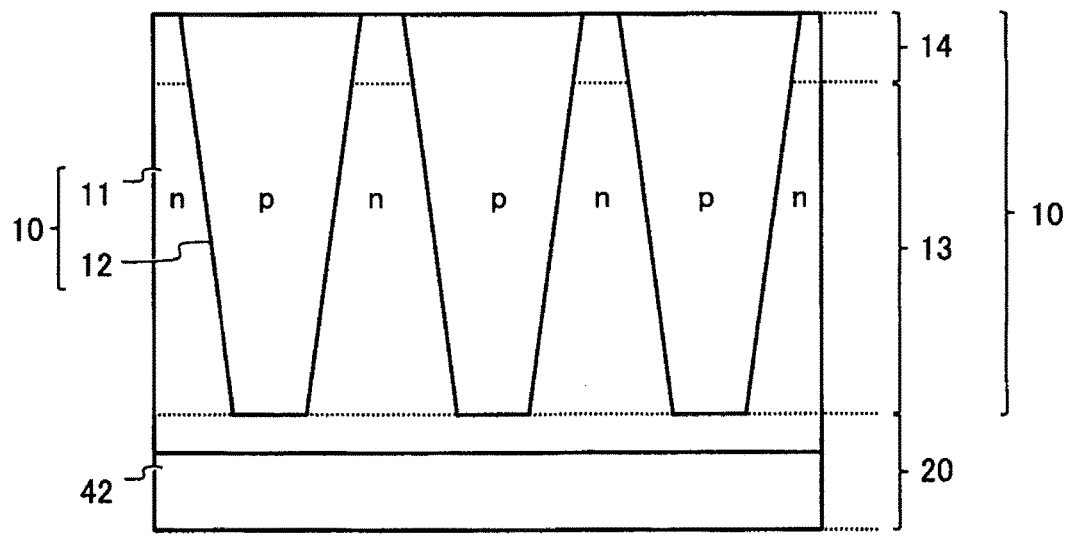
FIG. 12C shows an exemplary configuration of the semiconductor device 100 after the trench embedding.

FIG. 12C shows an exemplary configuration of the semiconductor device 100 after the trench embedding. The p-type columns 12 are formed by p-type epitaxial growth within the formed trench structure. The p-type columns 12 each have a constant impurity concentration. The p-type columns 12 may be epitaxially grown to have a skewed concentration of p-type impurities.

Figure 12D:
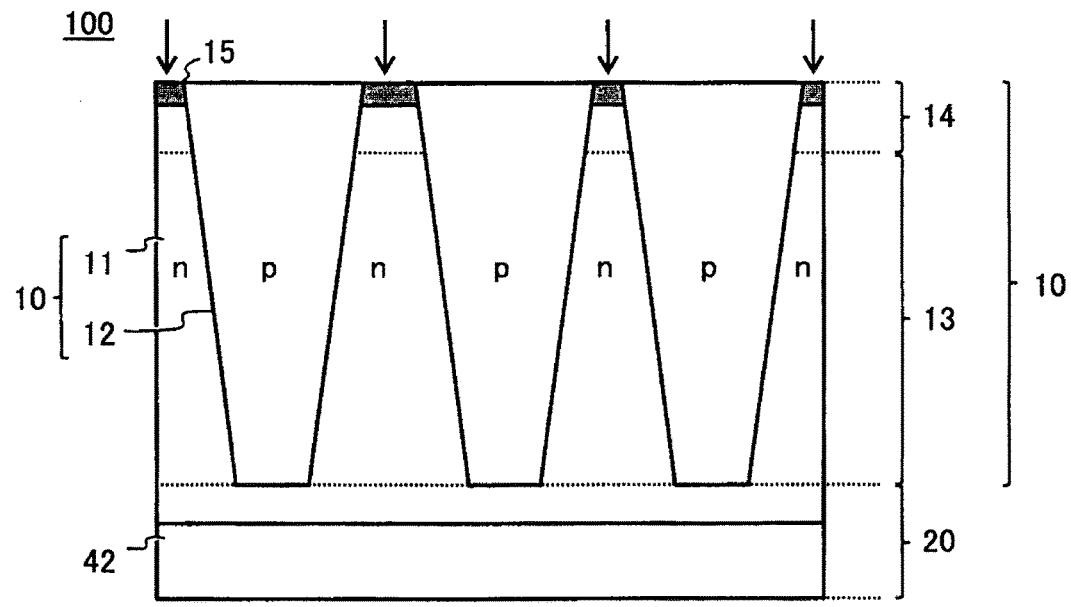
FIG. 12D shows an exemplary ion injection step in the stepped region 14.

FIG. 12D shows an exemplary ion injection step in the stepped region 14. In a prescribed region of the stepped region 14, n-type impurities for forming the n-type columns 11 are injected. In this way, the n-type columns 11 in the stepped region 14 are changed to the desired shape.

Figure 12E:
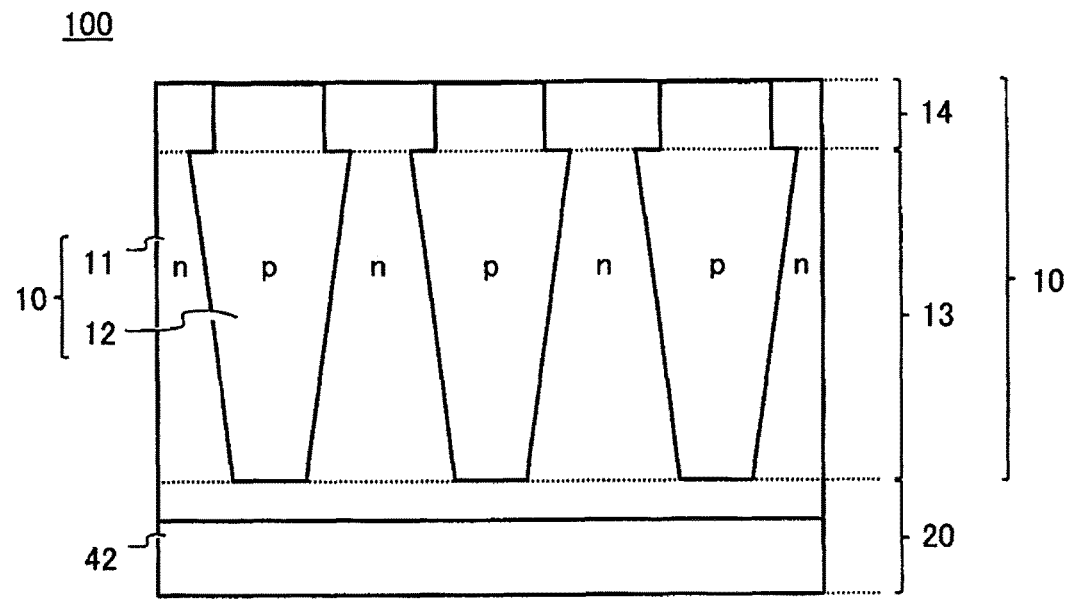
FIG. 12E shows an exemplary configuration of the semiconductor device 100 after thermal diffusion.

FIG. 12E shows an exemplary configuration of the semiconductor device 100 after thermal diffusion. The n-type columns 11 are formed by thermally diffusing the ions injected into the ion injection region 15. By using the manufacturing steps described above, it is possible to manufacture the semiconductor device 100 using trench embedding, even if the p-type columns 12 have indented shapes. With the trench embedding technique, the epitaxially grown n-type columns 11 have the same impurity concentration.

(Fourth Embodiment)

FIGS. 13A to 13E show an exemplary manufacturing method using trench embedding. The present example differs from the third embodiment with respect to the method for forming the stepped region 14.

Figure 13A:
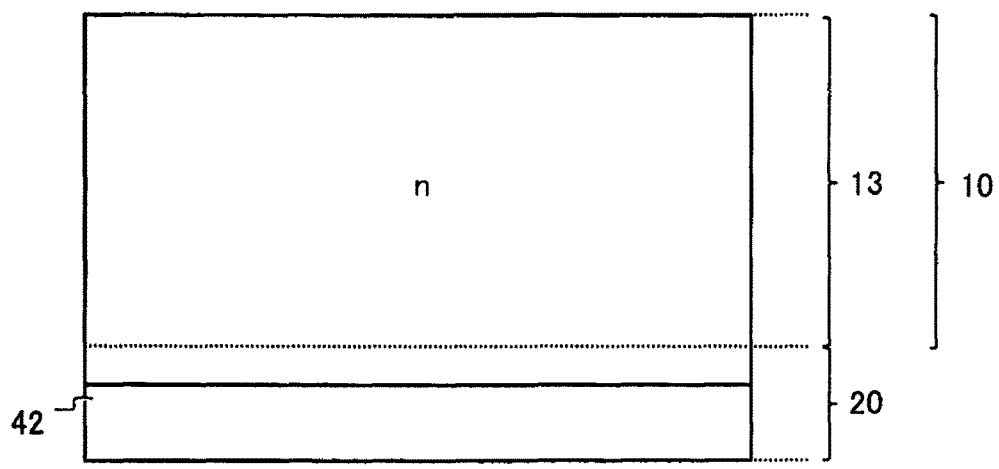
FIG. 13A shows the superjunction region 10 after the first stage of epitaxial growth.

FIG. 13A shows the superjunction region 10 after the first stage of epitaxial growth. The semiconductor device 100 of this example includes a superjunction region 10 formed using trench embedding. The superjunction region 10 is epitaxially grown in two stages.

Figure 13B:
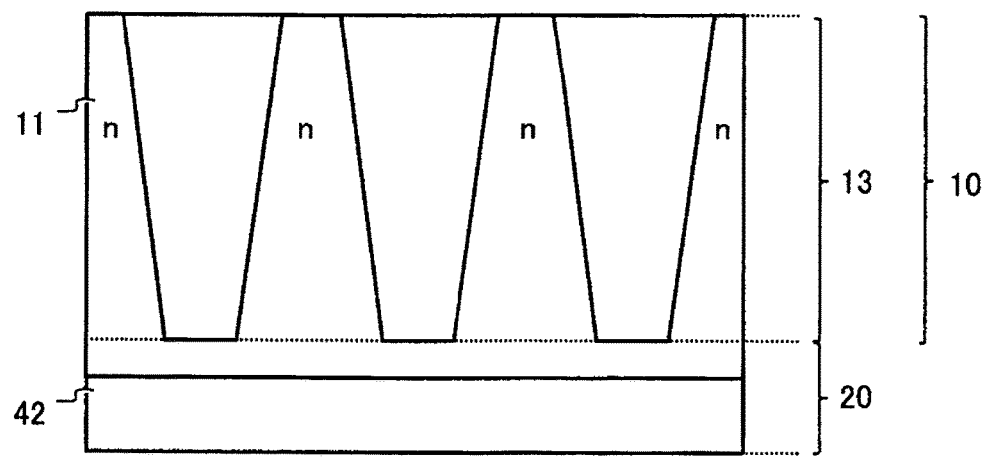
FIG. 13B shows an exemplary configuration of the semiconductor device 100 after the trench formation step.

FIG. 13B shows an exemplary configuration of the semiconductor device 100 after the trench formation step. The trench structure having the shape of the p-type columns 12 are formed by deep trench etching of the superjunction region 10 after the epitaxial growth.

Figure 13C:
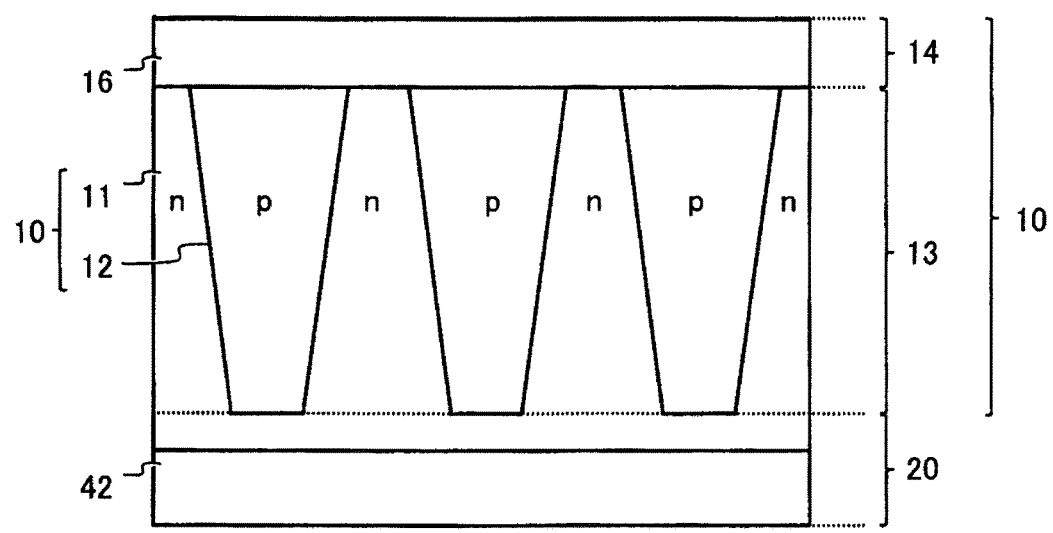
FIG. 13C shows an exemplary configuration of the semiconductor device 100 after the trench embedding.

FIG. 13C shows an exemplary configuration of the semiconductor device 100 after the trench embedding. The p-type columns 12 are formed by p-type epitaxial growth in the formed trench structure. The p-type columns 12 have a constant impurity concentration. Instead, the p-type columns 12 may be epitaxially grown to have a skewed p-type impurity concentration. A semiconductor layer 16 that will become the stepped region 14 is epitaxially grown on the top of the column skew region 13.

Figure 13D:
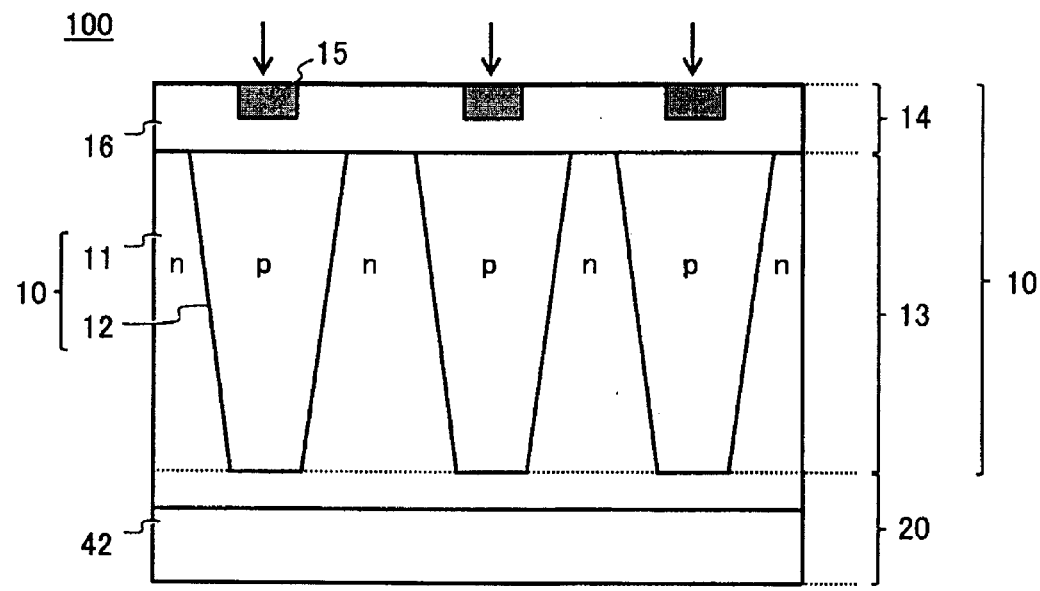
FIG. 13D shows an exemplary ion injection step in the stepped region 14.

FIG. 13D shows an exemplary ion injection step in the stepped region 14. In a prescribed region of the stepped region 14, p-type impurities for forming the p-type columns 12 are injected. Furthermore, n-type impurities for forming the n-type columns 11 may be injected as needed. In this way, the n-type columns 11 and the p-type columns 12 are changed to the desired shape in the stepped region 14.

Figure 13E:
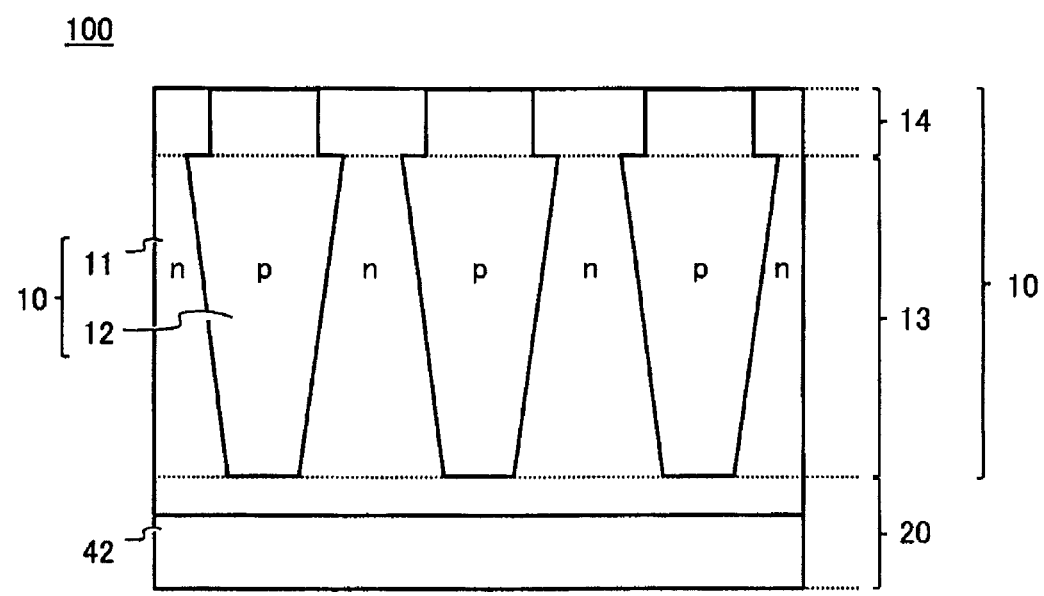
FIG. 13E shows an exemplary configuration of the semiconductor device 100 after the thermal diffusion.

FIG. 13E shows an exemplary configuration of the semiconductor device 100 after the thermal diffusion. The p-type columns 12 are formed by thermally diffusing the ions injected into the ion injection region 15. By using the manufacturing steps described above, it is possible to manufacture the semiconductor device 100 using trench embedding, even if the p-type columns 12 have indented shapes. With the trench embedding technique, the epitaxially grown n-type columns 11 have the same impurity concentration. The semiconductor layer 16 may have the same impurity concentration as the n-type columns 11.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device having a superjunction structure formed by a first conduction type column and a second conduction type column, comprising:
   a first region of the superjunction structure in which a PN ratio, which is a ratio of total P dopants to total N dopants, increases in a direction from a first surface side to a second surface side of the superjunction structure; and
   a second region of the superjunction structure that contacts the first region and is adjacent to a channel region of the semiconductor device, wherein
   a PN ratio of the second region is less than the PN ratio at an end of the first region on the second surface side and a thickness of the second region is $\frac{1}{3}$ to $\frac{1}{7}$ of a thickness of the first region,
   the semiconductor device has a withstand voltage greater than or equal to 600 V, and
   in the first region, impurity concentration of the first conduction type is constant, and impurity concentration of the second conduction type continuously increases in a direction from the first surface side toward the second surface side,
   impurity concentrations of the first conduction type and the second conduction type in the second region are constant and higher than respective impurity concentrations of the first conduction type and the second conduction type in the first region, and at the border of the first region and the second region, side surfaces of one of the first conduction type column and the second conduction type column in the second region are recessed relative to side surfaces of the one of the first conduction type column and the second conduction type column in the first region, and side surfaces of another one of the first conduction type column and the second conduction type column in the second region are projected relative to side surfaces of the other one of the first conduction type column and the second conduction type column in the first region.

2. The semiconductor device according to claim 1, wherein in the superjunction structure, a total impurity concentration of the second conduction type is equal to a total impurity concentration of the first conduction type.

3. The semiconductor device according to claim 1, wherein in the second region, impurity concentration of the second conduction type is equal to impurity concentration of the first conduction type.

4. The semiconductor device according to claim 1, wherein the PN ratio of the first region changes continuously.

5. The semiconductor device according to claim 1, wherein the PN ratio of the second region is constant.

6. The semiconductor device according to claim 5, wherein the PN ratio of the second region is 1.

7. The semiconductor device according to claim 1, wherein the PN ratio at an end of the first region on the second surface side is greater than 1 and less than or equal to 1.5.

8. The semiconductor device according to claim 7, wherein the PN ratio at an end of the first region on the second surface side is greater than 1 and less than or equal to 1.3.

9. The semiconductor device according to claim 1, wherein the PN ratio of the second region is greater than the PN ratio at an end of the first region on the first surface side.

10. The semiconductor device according to claim 1, wherein width of the second conduction type column in the second region is less than width of the second conduction type column at an end of the first region on the second surface side.

11. The semiconductor device according to claim 1, wherein in the second region, width of the second conduction type column is constant.

12. The semiconductor device according to claim 1, wherein in the first region, width of the second conduction type column increases in a direction from the first surface side toward the second surface side.

13. The semiconductor device according to claim 1, wherein a drain region is formed on a first surface side of the superjunction structure, and a gate-source region is formed on a second surface side of the superjunction structure.

14. The semiconductor device according to claim 1, wherein the first conduction type is n type and the second conduction type is p type.

15. The semiconductor device according to claim 1, wherein in the first region, width of the second conduction type column increases in a direction from the first surface side toward the second surface side, and in the second region, width of the second conduction type column is constant.

16. The semiconductor device according to claim 1, wherein an impurity concentration of the first conduction type in the second region is substantially equal to an impurity of concentration of the second conduction type in the second region.

* * * * *